(12) United States Patent
Mehta et al.

(10) Patent No.: US 11,982,946 B2
(45) Date of Patent: May 14, 2024

(54) METROLOGY TARGETS

(71) Applicants: ASML NETHERLANDS B.V., Veldhoven (NL); ASML HOLDING N.V., Veldhoven (NL)

(72) Inventors: Nikhil Mehta, Stamford, CT (US); Maurits Van Der Schaar, Eindhoven (NL); Markus Gerardus Martinus Maria Van Kraaij, Eindhoven (NL); Hugo Augustinus Joseph Cramer, Eindhoven (NL); Olger Victor Zwier, Eindhoven (NL); Jeroen Cottaar, Eindhoven (NL); Patrick Warnaar, Tilburg (NL)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 211 days.

(21) Appl. No.: 17/628,668

(22) PCT Filed: Jul. 6, 2020

(86) PCT No.: PCT/EP2020/069001
§ 371 (c)(1),
(2) Date: Jan. 20, 2022

(87) PCT Pub. No.: WO2021/013519
PCT Pub. Date: Jan. 28, 2021

(65) Prior Publication Data
US 2022/0260929 A1    Aug. 18, 2022

Related U.S. Application Data

(60) Provisional application No. 62/877,569, filed on Jul. 23, 2019.

(30) Foreign Application Priority Data

Aug. 29, 2019    (EP) .................................... 19194215

(51) Int. Cl.
*G03F 7/20*      (2006.01)
*G01N 21/956*    (2006.01)
(Continued)

(52) U.S. Cl.
CPC ....... *G03F 7/70625* (2013.01); *G01N 21/956* (2013.01); *G03F 1/84* (2013.01); *G03F 7/70633* (2013.01)

(58) Field of Classification Search
CPC .... G03F 7/70625; G03F 1/84; G03F 7/70633; G03F 1/42; G01N 21/956
See application file for complete search history.

(56) References Cited

U.S. PATENT DOCUMENTS 6,952,253 B2   10/2005   Lof et al.
9,653,404 B1   5/2017    Wang et al.
(Continued)

FOREIGN PATENT DOCUMENTS

CN    1685286      10/2005
CN    109116674    1/2019
(Continued)

OTHER PUBLICATIONS

International Search Report and Written Opinion issued in corresponding PCT Application No. PCT/EP2020/069001, dated Oct. 5, 2020.
(Continued)

*Primary Examiner* — Mesfin T Asfaw
(74) *Attorney, Agent, or Firm* — Pillsbury Winthrop Shaw Pittman, LLP

(57) ABSTRACT

A patterning device for patterning product structures onto a substrate and an associated substrate patterned using such a
(Continued)

patterning device. The patterning device includes target patterning elements for patterning at least one target from which a parameter of interest can be inferred. The patterning device includes product patterning elements for patterning the product structures. The target patterning elements and product patterning elements are configured such that the at least one target has at least one boundary which is neither parallel nor perpendicular with respect to the product structures on the substrate.

20 Claims, 7 Drawing Sheets

(51) Int. Cl.
*G03F 1/84* (2012.01)
*G03F 7/00* (2006.01)

(56) References Cited

U.S. PATENT DOCUMENTS

| 2006/0146329 | A1* | 7/2006 | Jung ............... G03F 9/7088 356/401 |
|---|---|---|---|
| 2007/0008533 | A1 | 1/2007 | Ghinovker |
| 2007/0224518 | A1 | 9/2007 | Yokhin et al. |
| 2007/0296960 | A1 | 12/2007 | Den Boef et al. |
| 2008/0198380 | A1 | 8/2008 | Straaijer et al. |
| 2009/0168062 | A1 | 7/2009 | Straaijer |
| 2009/0224413 | A1 | 9/2009 | Ghinovker |
| 2010/0007863 | A1 | 1/2010 | Jordanoska |
| 2010/0328655 | A1 | 12/2010 | Den Boef |
| 2011/0026032 | A1 | 2/2011 | Den Boef et al. |
| 2011/0032500 | A1 | 2/2011 | Straaijer |
| 2011/0102753 | A1 | 5/2011 | Van De Kerkhof et al. |
| 2011/0102793 | A1 | 5/2011 | Straaijer |
| 2011/0188020 | A1 | 8/2011 | Den Boef |
| 2011/0249244 | A1 | 10/2011 | Leewis et al. |
| 2012/0044470 | A1 | 2/2012 | Smilde et al. |
| 2012/0044495 | A1 | 2/2012 | Straaijer |
| 2013/0162996 | A1 | 6/2013 | Straaijer et al. |
| 2013/0304424 | A1 | 11/2013 | Bakeman et al. |
| 2013/0308142 | A1 | 11/2013 | Straaijer |
| 2014/0019097 | A1 | 1/2014 | Bakeman et al. |
| 2016/0161863 | A1 | 6/2016 | Den Boef et al. |
| 2016/0282282 | A1 | 9/2016 | Quintanilha et al. |
| 2017/0184981 | A1 | 6/2017 | Quintanilha et al. |

FOREIGN PATENT DOCUMENTS

| EP | 1628164 | 2/2006 |
|---|---|---|
| TW | 556297 | 10/2003 |
| WO | 2010025950 | 3/2010 |
| WO | 2011012624 | 2/2011 |
| WO | 2019068459 | 4/2019 |
| WO | 2019110211 | 6/2019 |
| WO | 2019166190 | 9/2019 |

OTHER PUBLICATIONS

Lemaillet, P. et al.: "Intercomparison between optical and X-ray scatterometry measurements of FinFET structures", Proc. of SPIE, vol. 8681 (2013).

Taiwanese Office Action issued in corresponding Taiwanese Application No. 109124517, dated May 31, 2021.

Office Action issued in corresponding Chinese Patent Application No. 202080048483.6, dated Feb. 1, 2024.

* cited by examiner

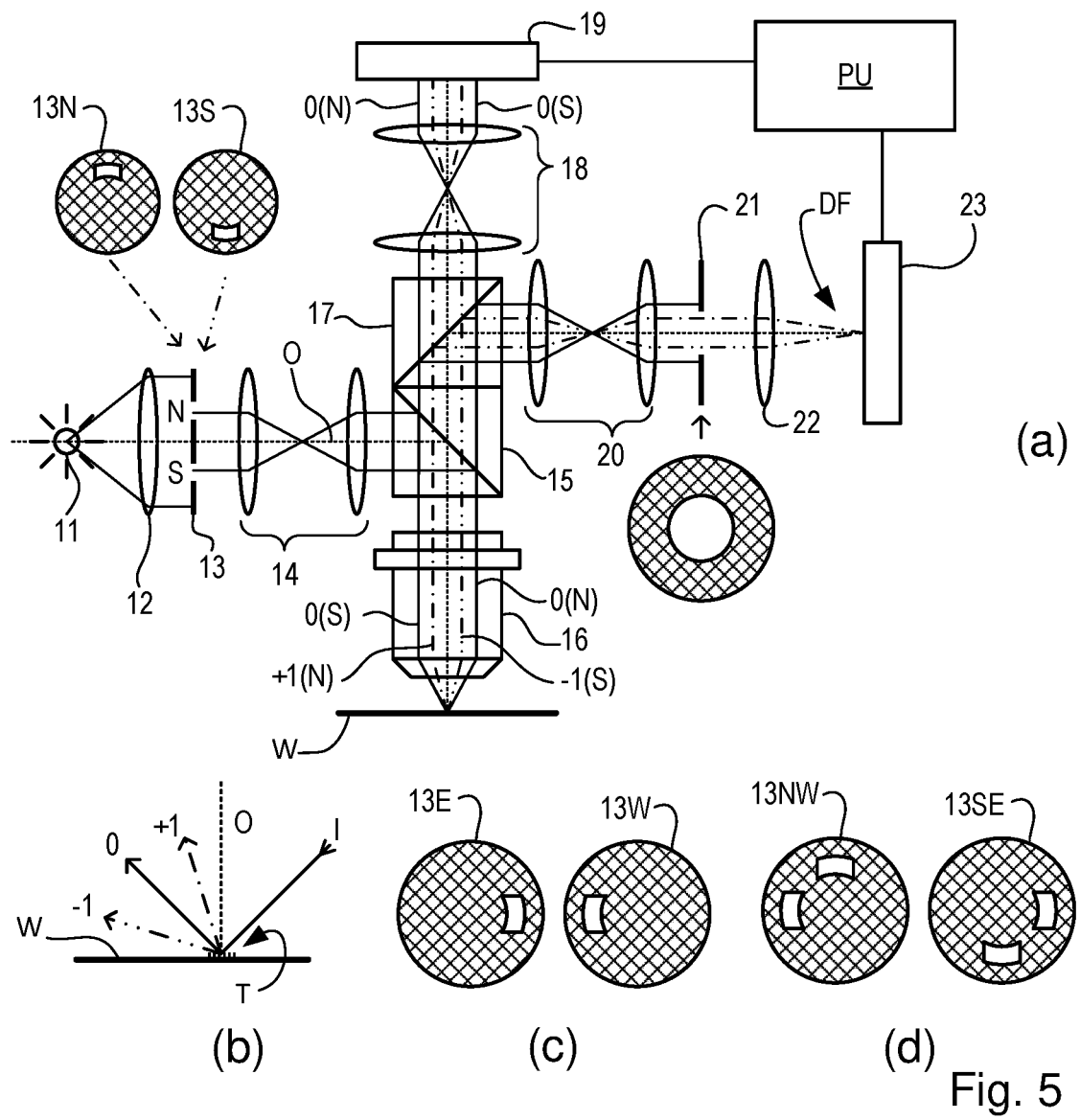
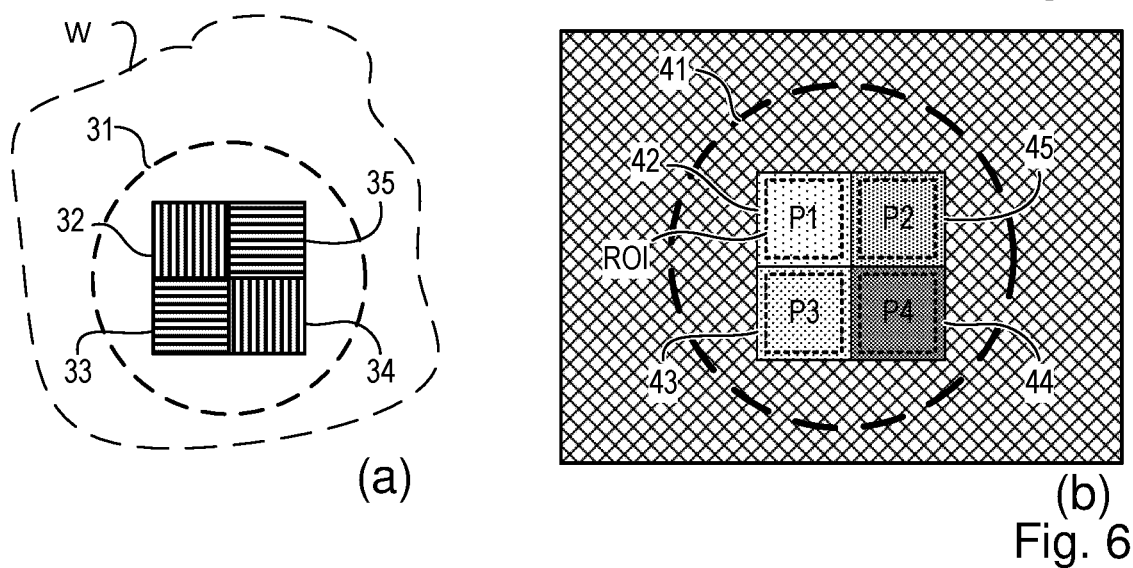
Fig. 5
Fig. 6

(a) (b)

(a) (b)

METROLOGY TARGETS

CROSS REFERENCE TO RELATED APPLICATIONS

This application is the U.S. national phase entry of PCT Patent Application No. PCT/EP2020/069001 which was filed on Jul. 6, 2020, which claims the benefit of priority of U.S. patent application No. 62/877,569 which was filed on Jul. 23, 2019, and of European Patent Application No. 19194215.0 which was filed on Aug. 29, 2019, and which are incorporated herein in their entireties by reference.

FIELD

The present invention relates to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as alignment tools for proper positioning of a substrate prior to an exposure and scatterometry based tools for inspecting/measuring the exposed and/or etched product in process control; e.g., to measure overlay.

The effect of the presence of neighboring product structures can affect such metrology tools, for example when measuring overlay. It would be desirable to mitigate this issue.

SUMMARY

In a first aspect of the invention there is provided a patterning device for patterning product structures onto a substrate, the patterning device comprising: target patterning elements for patterning at least one target from which a parameter of interest can be inferred, and product patterning elements for patterning said product structures; wherein said target patterning elements and product patterning elements are configured such that said at least one target has at least one boundary which is neither parallel nor perpendicular with respect to said product structures on said substrate.

In a second aspect of the invention there is provided a patterning device for patterning product structures onto a substrate, the patterning device comprising: target patterning elements for patterning at least one target from which a parameter of interest can be inferred, said target patterning elements being configured to form a sub-segmented target; and product patterning elements for patterning said product structures; wherein said target patterning elements and product patterning elements are configured such that a direction of periodicity of the sub-segmentation of the sub-segmented target is neither parallel nor perpendicular with the respect to said product structures on said substrate.

In a third aspect of the invention there is provided substrate comprising: product structures operable to form a functioning integrated circuit or part thereof; and a target for measuring from which a parameter of interest can be inferred, wherein said target has at least one boundary which is neither parallel nor perpendicular with respect to said product structures

BRIEF DESCRIPTION OF THE DRAWINGS

Embodiments of the invention will now be described, by way of example only, with reference to the accompanying schematic drawings, in which:

FIG. 5 comprises (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures;

FIG. 6 depicts (a) a known form of multiple grating target and an outline of a measurement spot on a substrate; and (b) an image of the target obtained in the scatterometer of FIG. 5;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
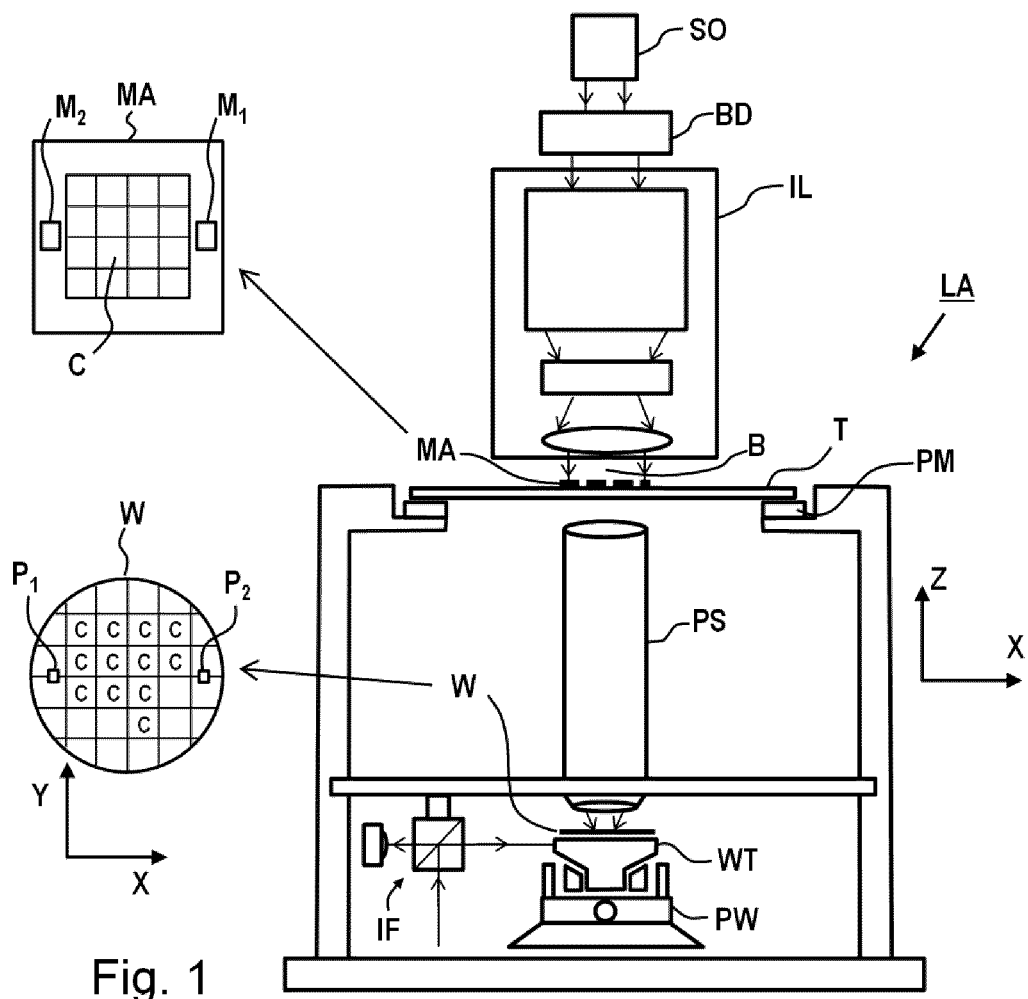
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
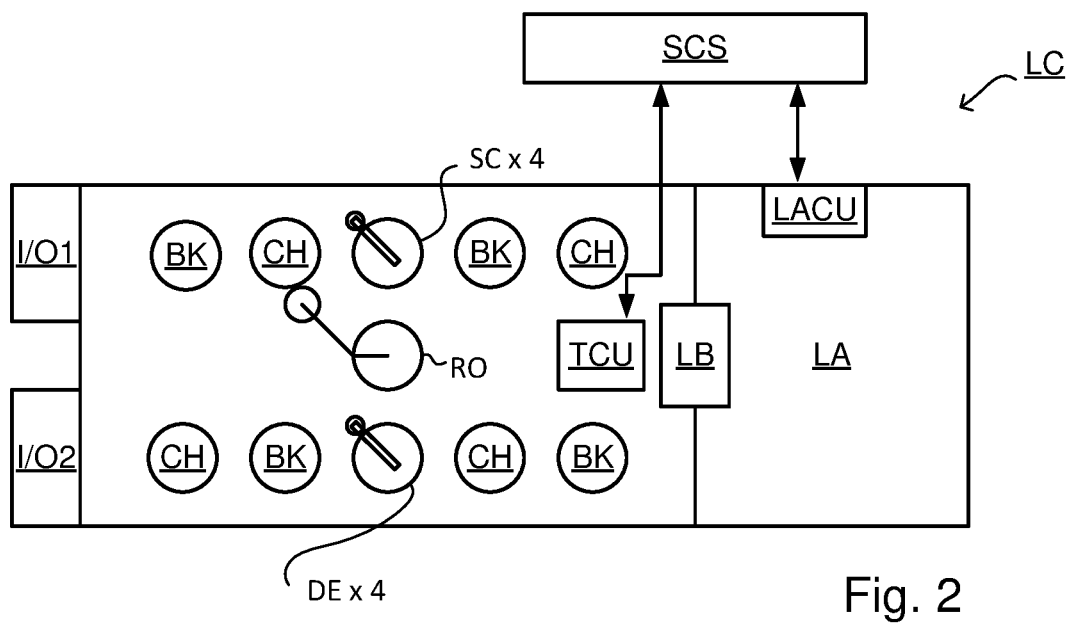
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
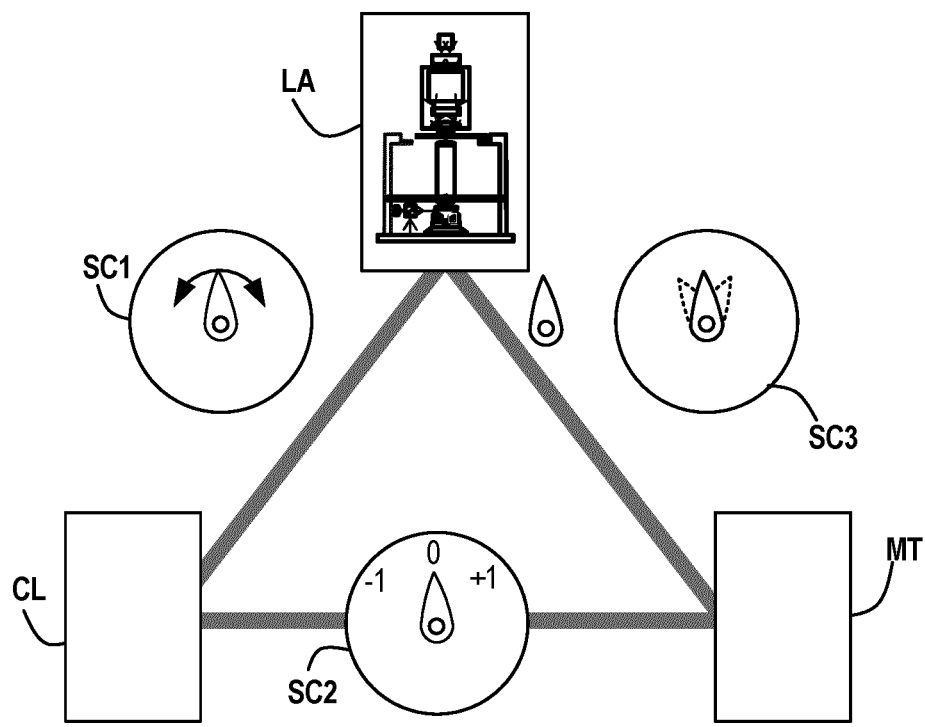
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target arrangement and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states.

Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

Figure 4:
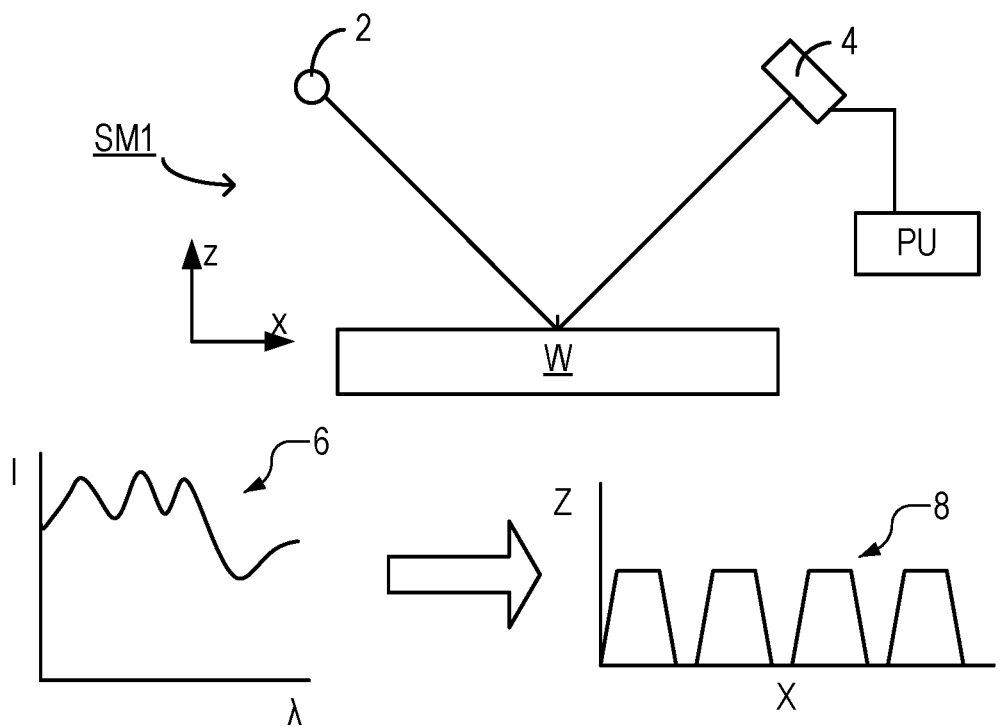
FIG. 4 depicts a schematic overview of a scatterometry apparatus used as a metrology device, which can measure targets according to embodiments of the invention.

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

FIG. 5(a) presents an embodiment of a metrology apparatus and, more specifically, a dark field scatterometer. A target T and diffracted rays of measurement radiation used to illuminate the target are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the illumination angles can be designed or adjusted so that the first order rays entering the objective lens are closely aligned with the central optical axis. The rays illustrated in FIGS. 5(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 5(c) and (d). The use of these, and numerous other variations and applications of the apparatus are described in prior published applications, mentioned above.

FIG. 6(a) depicts a target arrangement or composite target formed on a substrate according to known practice. The target arrangement in this example comprises four targets (e.g., gratings) 32 to 35 positioned closely together so that they will all be within a measurement spot 31 formed by the metrology radiation illumination beam of the metrology apparatus. The four targets thus are all simultaneously illuminated and simultaneously imaged on sensors 19 and 23. In an example dedicated to measurement of overlay, targets 32 to 35 are themselves composite gratings formed by overlying gratings that are patterned in different layers of the semi-conductor device formed on substrate W. Targets 32 to 35 may have differently biased overlay offsets in order to facilitate measurement of overlay between the layers in which the different parts of the composite gratings are formed. The meaning of overlay bias will be explained below with reference to FIG. 7. Targets 32 to 35 may also differ in their orientation, as shown, so as to diffract incoming radiation in X and Y directions. In one example, targets 32 and 34 are X-direction gratings with biases of the +d, −d, respectively. Targets 33 and 35 are Y-direction gratings with offsets +d and −d respectively. Separate images of these gratings can be identified in the image captured by sensor 23. This is only one example of a target arrangement. A target arrangement may comprise more or fewer than 4 targets, or only a single target.

FIG. 6(b) shows an example of an image that may be formed on and detected by the sensor 23, using the target of FIG. 6(a) in the apparatus of FIG. 5, using the aperture plates 13NW or 13SE from FIG. 5(d). While the pupil plane image sensor 19 cannot resolve the different individual targets 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of targets 32 to 35. In this way, the images do not have to be aligned very precisely at a specific location within the sensor frame, which greatly improves throughput of the measuring apparatus as a whole.

Once the separate images of the targets have been identified, the intensities of those individual images can be measured, e.g., by averaging or summing selected pixel intensity values within the identified areas (e.g., regions of interest ROIs). Intensities and/or other properties of the images can be compared with one another. These results can be combined to measure different parameters of the lithographic process. Overlay performance is an important example of such a parameter.

In one embodiment of the metrology apparatus (e.g., scatterometer), the metrology apparatus is adapted to measure the overlay of two misaligned gratings or periodic structures by measuring asymmetry in the reflected spectrum and/or the detection configuration, the asymmetry being related to the extent of the overlay. A similar method may be used to measure focus on special targets which are formed with a focus dependent asymmetry. In the overlay case, the two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

For diffraction based overlay (DBO) metrology, the overlay is derived using only intensity information from radiation diffracted by stacked gratings. This yields a measurement sensitivity that is highly wavelength dependent, due to the refractive index of the stack being measured. This wavelength dependency, often described by a swing curve, is also highly dependent on the composition and thickness of the stack which results in a process-robustness challenge.

An issue with overlay measurements on targets near, within or adjacent to product areas is that of optical crosstalk. Optical crosstalk between neighboring (product) structures and the metrology targets can perturb the overlay measurement. The use of fully spatially coherent illumination, for example, can introduce systematic artefacts, such as ringing and speckle, due to the coherent addition of complex fields. By way of example, this effect has been demonstrated in simulation. To estimate the impact on overlay measurement of the neighboring product, the simulation measured the same target under identical conditions other than the presence and absence of neighboring product. Overlay error (i.e., error in the overlay measurement with respect to the actual overlay simulated) was calculated from the simulated measurements as a function of the size of the ROI (i.e., as a function of the percentage of the area corresponding to the grating which is averaged to obtain an intensity value for that grating). The simulation showed that there was a greater swing and larger peaks (larger overlay errors) when neighboring product was present compared to when it was absent, this increased swing being multiple times greater.

Optical crosstalk from surrounding product is manifestation of the coherent diffraction of optical field from the surrounding features. A discontinuity feature, such as a boundary e.g., the boundary edge of the neighboring product (which acts similarly to a neighboring grating pad or target), can result in a particularly strong crosstalk issue. This can be understood by considering the well-known phenomenon that a finite aperture illuminated with a coherent source exhibits diffraction from its boundary, and that diffraction fringes from the boundary are conformal to the boundary.

Figure 7:
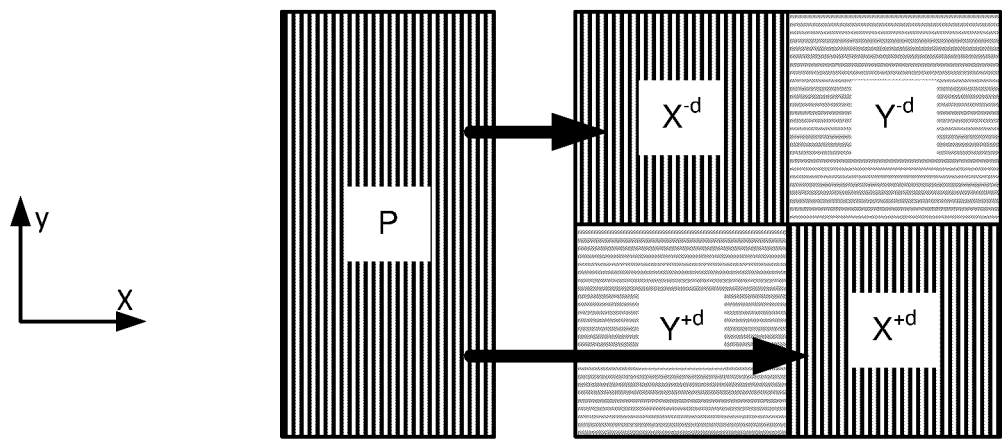
FIG. 7 conceptually illustrates the issue of crosstalk from surrounding product structures.

FIG. 7 is a schematic layout of the simulation described above, which illustrates this point. The neighboring product P is modelled as a diffraction grating with grating vector oriented along x. The vertical boundaries of each of the targets $X^{+d}$, $X^{-d}$, $Y^{-d}$, $Y^{-d}$ and of the neighboring product P exhibit ringing features which are self-similar to the boundaries, and which spread across the x direction (assuming x-direction illumination incidence). This is symbolized by the arrows, which illustrate that the (x oriented grating) neighboring product P induces crosstalk in the X targets $X^{+d}$, $X^{-d}$, but have an insignificant or at least less pronounced effect along the y direction. Because of this, the ±1st order diffraction signal from X targets $X^{+d}$, $X^{-d}$ will be affected by the neighboring product P.

A number of target designs will now be described which aim to mitigate this feature. Throughout the text, the term "target" will be used to describe a single pad or region which may form part of a larger target arrangement or compound target such as illustrated in FIG. 6; e.g., for the measurement of a parameter of interest such as overlay. The targets comprise at least one boundary which is neither parallel nor perpendicular (i.e., oblique) with respect to the (e.g., predominant) direction of product structures (e.g., which may define a substrate's or die's x/y coordinate system). A boundary of a target in this context may describe the periphery or envelope marking the extent of a target, and may include an internal boundary of a compound target arrangement comprising more than one targets (target pads); i.e., an internal boundary may be one or both of the boundaries dividing a +d biased X-direction target from a +d biased Y-direction target in a typical diffraction based overlay type target arrangement.

In an embodiment, targets comprise at least one boundary or boundary which is neither parallel nor perpendicular (i.e., oblique) with respect to the product structures on the substrate and more specifically neighboring product. In a further embodiment, the target may comprise at least two boundaries which are neither parallel nor perpendicular with the neighboring product. The orientation of the neighboring product refers to one or more of the direction of its boundary and/or the direction of periodicity of repeated structures comprised within the neighboring product. In the context of this disclosure, neighboring or adjacent can be taken to mean within the field-of-view of the metrology tool being used to perform a measurement. In other embodiments, neighboring or adjacent may mean within 60 µm, within 50 µm, within 40 µm, within 30 µm, within 20 µm or within 10 µm.

The angle of the at least one boundary may be, for example between 10 and 80 degrees with respect to the neighboring product, between 20 and 70 degrees with respect to the neighboring product, or between 30 and 60 degrees with respect to the neighboring product. In some embodiments the at least one boundary is 45 degrees with the neighboring product. The grating orientation (orientation of the grating vector) may, for example, be oriented with the at least one boundary or oriented conventionally (e.g., with the product).

Figure 8:
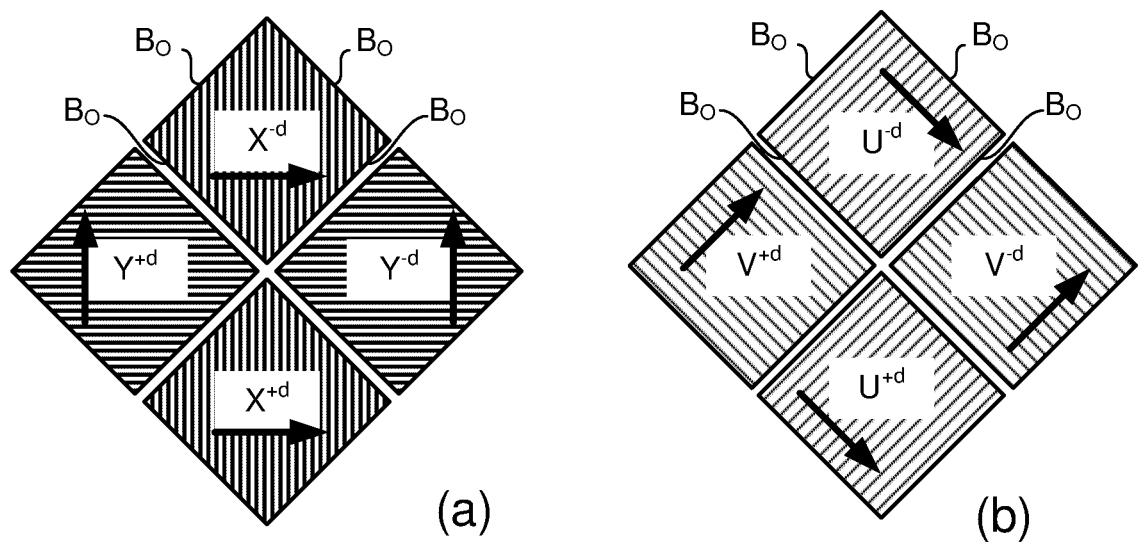
FIG. 8 illustrates three target arrangements comprising targets according to different embodiments of the invention.
Figure 8:
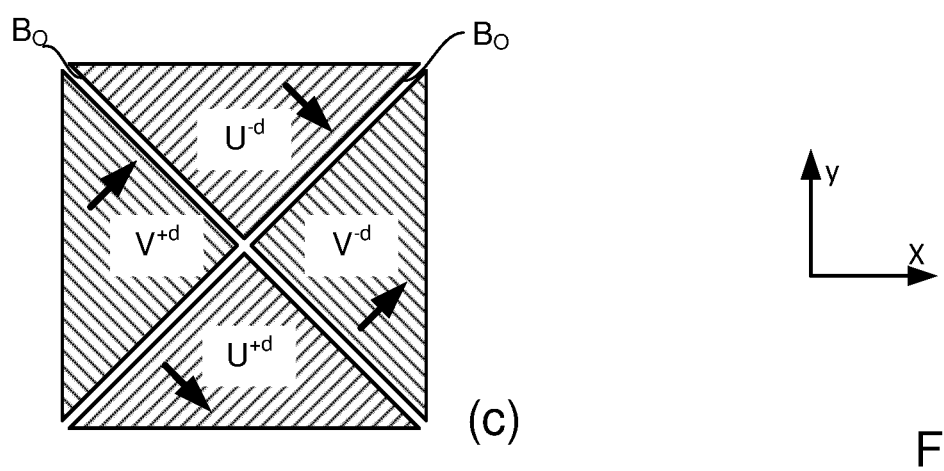

FIG. 8 illustrates three different target arrangement designs, each comprising four targets; a first pair of targets in a first direction $X^{+d}$, $X^{-d}$, $U^{+d}$, $U^{-d}$ and a second pair of targets in a second direction $Y^{+d}$, $Y^{-d}$, $V^{+d}$, $V^{-d}$ each target of a pair having a different bias (e.g., as is conventional for measuring overlay in two directions). In each case, oblique boundaries (i.e., a boundary which is neither parallel nor perpendicular with respect to the product structures and/or coordinate system of the substrate) of at least one of the targets of the target arrangements is labelled Bo.

In FIG. 8(a) the boundaries of the target arrangement (and therefore the target area of all four targets) are oriented at 45 degrees with respect to neighboring product. The grating vectors however are oriented conventionally in the x and y directions within the tilted target areas. As such, within the coordinate system of the substrate and product, each target $X^{+d}$, $X^{-d}$, $Y^{+d}$, $Y^{-d}$ may comprise a rhombus shape, and more specifically may comprise a 45 degree tilted square (90 degree rhombus) or rectangle (the targets may actually be a near-square rectangle, similar to the conventionally oriented targets typically used at present). Note that the targets of these FIG. 8 embodiments may comprise rectangles tilted at an (oblique) angle other then 45 degrees.

FIG. 8(b) shows the target boundaries and target areas being arranged and oriented in a similar manner to that of FIG. 8(a), but with the grating vector within the target areas also being oriented with the boundaries and such that the grating vector of the first pair of targets $U^{+d}$, $U^{-d}$, is normal to that of the second pair of targets $V^t$, $V^d$ In this way, the gratings are also oriented 45/−45 degrees as well as the target areas and boundaries. Note that each of these targets will measure overlay signal in both of the x and y directions; a method for converting the captured measurement signal into overlay in x and y directions is described below.

FIG. 8(c) shows an arrangement where the targets $U^{+d}$, $U^{-d}$, $V^{+d}$, $V^{-d}$ are triangular and fit together such that the full composite target arrangement is square or rectangular shape. This can help with accommodating the target arrangement in the area reserved for metrology in a typical layer design (which often assumes square target arrangements). Furthermore, such a target arrangement is more area efficient and compact, providing larger pads for a given substrate area (e.g., per real estate available). This more optimal use of the available real estate provides greater opportunity for choosing a better ROI, and therefore can increase robustness of the overlay measurement (this also applies to the FIGS. 9 and 10 arrangements described below).

In each case, the orientation of (at least some of) the target boundaries minimizes the overlap between the diffraction fringes from the target and from the product. In this way, the proposed layout with oblique boundaries achieves the objective of reduced cross-talk by minimizing the target-product interaction. This effect can be further enhanced by also orienting the grating angle (grating vector) differently to the product. More specifically, the oblique boundaries minimize overlap in the image plane and oblique gratings additionally minimize overlap in the pupil (Fourier) plane.

Another advantage of the target arrangements illustrated is that, in each case, the targets pairs having a parallel grating vector are located to minimize overlap between their diffraction signatures in the field. This minimizes intra-grating cross-talk between targets having parallel grating vectors. For example, the two x-targets are placed along the y dimension (and vice versa), in the case of the target arrangements of FIG. 8(a). Similarly in the target arrangements of FIGS. 8(b), 8(c), FIGS. 9(a) and 9(b) and FIG. 11(a), target pairs comprising parallel grating vectors are not aligned in the direction normal to the grating vector axis for the target pair, but are offset (e.g., no target is directly in front or directly behind another target with parallel grating direction in the grating vector direction). More specifically, in each of these examples (except that of FIG. 9(b)), the offset is such that there is no overlap of the targets in the direction normal to the grating vector axis for the target pair. The placement of targets such as to minimize this diffraction overlap results in in-phase addition (no relative phase) of the diffracted signal from both targets of a target pair.

Rotated overlay targets ideally should be measured under illumination and detection angle which is aligned to the orientation of the grating pitch. This could be solved in the optics, which is very difficult and/or expensive. While this remains within the scope of the disclosure, it is instead proposed to rotate the wafer under the same angle as the grating.

FIG. 9(a) shows a target arrangement generalizing for arbitrary angle of pitch orientation. In this example, the overlay results $OV_u$, $OV_v$ will be provided along a new coordinate system u,v. These overlay values $OV_u$, $OV_v$ can be converted to overlay values $OV_x$, $OV_y$ in the regular coordinate system (x,y) by:

$$OV_x = OV_u \cdot \cos(\theta) - OV_v \cdot \sin(\theta)$$

$$OV_y = OV_u \cdot \sin(\theta) + OV_v \cdot \cos(\theta)$$

where θ is the grating angle with respect to x. This treatment is also applicable for the examples of FIGS. 8(b) and 8(c), where θ=45°.

FIG. 9(b) illustrates a variation on the generalized pitch angle target arrangement of FIG. 9(a). In this example, each target $U^{+d}$, $U^{-d}$, $V^{+d}$, $V^{-d}$ comprises the same shape and size, with a "hole" or gap in the center (rather than off-center) as is conventional. Note that the targets of FIG. 8 could also be adapted to provide for such a hole.

Figure 9:
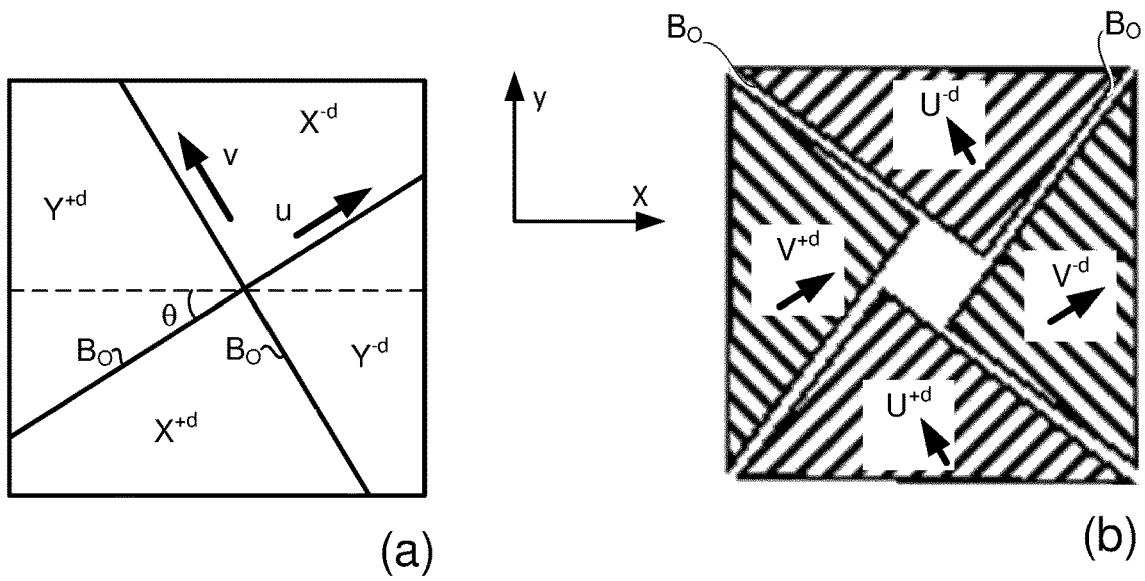
FIG. 9 illustrates two generalized target arrangements comprising targets according to an embodiment of the invention.
Figure 10:
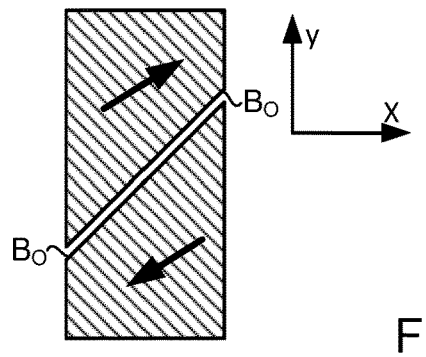
FIG. 10 illustrates a target arrangement comprising targets for measuring overlay in a single oblique direction according to an embodiment of the invention.

One application for the target arrangement of FIG. 9, is to enable the grating vector to be oriented with a tilted product structure. Tilted product structures, e.g., a memory arrangement with tilted word-lines and/or bit-lines are sometimes used to optimize product shrinkage. Having a grating oriented with the product structure will aid overlay measurements and make them more robust.

Instead of the arrangement of FIG. 9, it may be preferable to adapt the arrangement of either of FIG. 8(b) or FIG. 8(c), such that the target boundaries remain at 45/−45 degrees, but the gratings are oriented with the (tilted) product structure, where the tilted product structure is tilted (with respect to the x/y coordinate system) at an angle other than 45 degrees. This has the additional main benefit of the target boundaries not being oriented with the product structure, resulting in the crosstalk suppression already discussed. In some such cases it might be sufficient to measure overlay for only a single direction, rather than two. As such, a two-target arrangement such as that shown in FIG. 10 may be appropriate. This will simplify the target arrangement layout and reduce that real-estate. The FIG. 10 example has the gratings aligned in the product direction (each target having a different offset). The angle of the boundaries at the boundary of the two targets may be at the same angle as the gratings, at 45 degrees (as illustrated here) or at another angle.

In another variation, a four target arrangement may comprise targets in two non-orthogonal directions (rather than two orthogonal directions in the examples above). The grating angles can be aligned independently to individual layer constraints. For example, a first target pair may be aligned with the bit-lines of a memory (e.g., DRAM) array and a second target pair aligned with the word-lines. Note that, when measuring such a target arrangement, there is a risk of additional reflections in the sensor due to the non-perpendicular diffraction angle. Therefore, measuring a target arrangement with non-orthogonal grating angles, account should be made for limitations in the wavelength/pitch-regime to avoid certain diffraction angles.

Targets aligned with product structures can be combined with such targets rotated to be unaligned (oblique to) product-structures. Such a target can be used to investigate and/or evaluate the impact of crosstalk with product-structures and correct for this effect.

Figure 11:
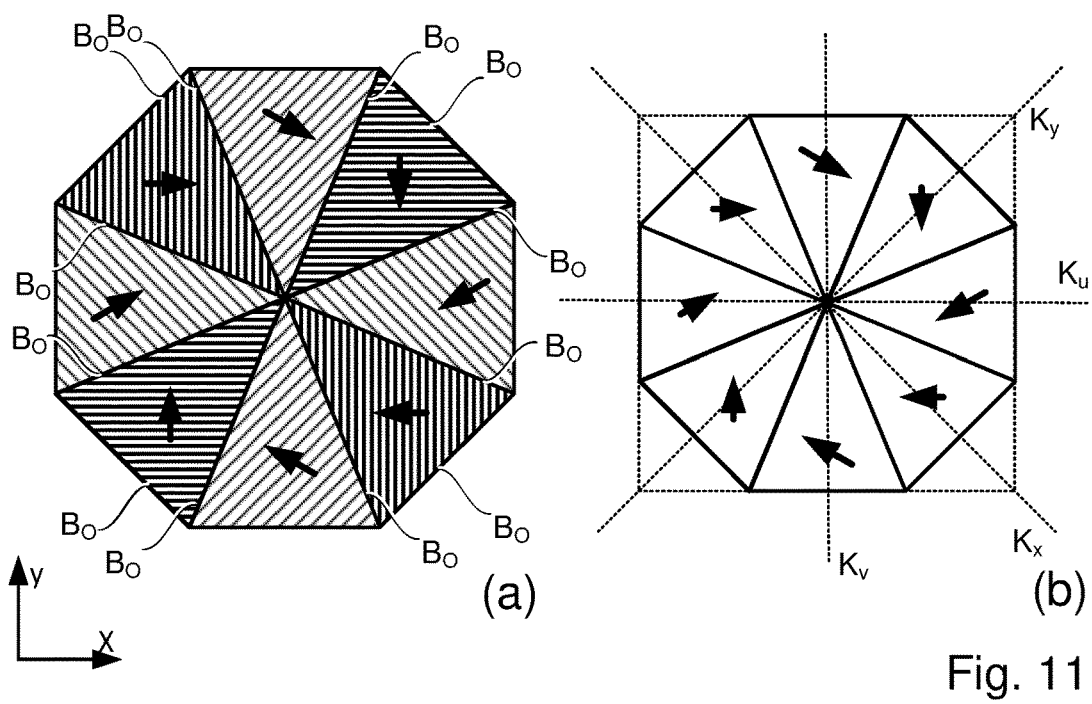
FIG. 11 illustrates a target arrangement comprising targets for measuring overlay in four directions according to an embodiment of the invention.

FIG. 11(a) illustrates a specific example target arrangement with aligned targets (four targets indicated by arrows parallel with x or y) and oblique targets (four targets indicated by arrows not parallel with x or y). For such a target arrangement, the overlay sensitivity (K) should be calculated for every target pair (e.g., pair by direction) separately. This is illustrated by FIG. 11(b), which illustrates the overlay sensitivity $K_u$, $K_v$, $K_x$ and $K_y$ for each of the u, v, x and y directions. Because of the redundant information in overlay parameters, there is room for two additional (intensity or asymmetry) correction parameters, e.g. spatially or bias-angle dependent parameters. This particular octagonal arrangement further provides for 90 degree rotational symmetry in an area efficient package.

Figure 12:
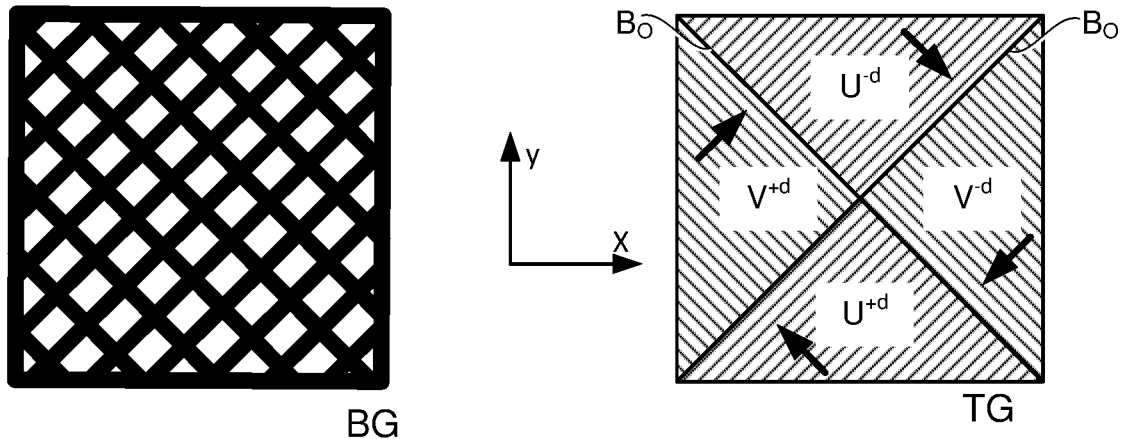
FIG. 12 illustrates a target arrangement comprising targets for measuring overlay and alignment according to an embodiment of the invention.

FIG. 12 illustrates another embodiment of a target comprising an oblique top grating TG (such as described above) in a top layer in combination with a sieve-type oblique 2D grating (e.g., a 2D alignment grating) as the bottom grating BG in a lower layer. Such a target may be used as a combined alignment and Overlay target, thereby reducing real-estate and alignment-to-overlay errors. The top grating TG may comprise any of the oblique grating target arrangements described above; and more specifically, may comprise the arrangement of FIG. 9(b) (e.g., with central hole to aid alignment measurement) as an alternative to that of FIG. 8(c) illustrated.

In a further embodiment, a target is proposed with all boundaries either parallel or perpendicular to product (e.g., a square/rectangular target), the gratings parallel or perpendicular with product, but with obliquely oriented sub-segmentation. Sub-segmentation of a target grating is sometimes used to comply with certain design rules. For example, the sub-segmentation may comprise product-like structures which, for example, may be below the resolution limit of the metrology tool used to measure them. The obliquely oriented sub-segmentation may also be used in combination with any of the other targets and target arrangements described above. Such an arrangement might help in overall overlay accuracy (better defined start/end of lines for example).

In other embodiments with sub-segmentation, the targets may comprise any of the target arrangements described herein, with one or more oblique boundaries and optionally oblique grating vectors, and comprising a sub-segmentation aligned with one or both of the substrate's x/y coordinate system and the product structures.

Figure 13:
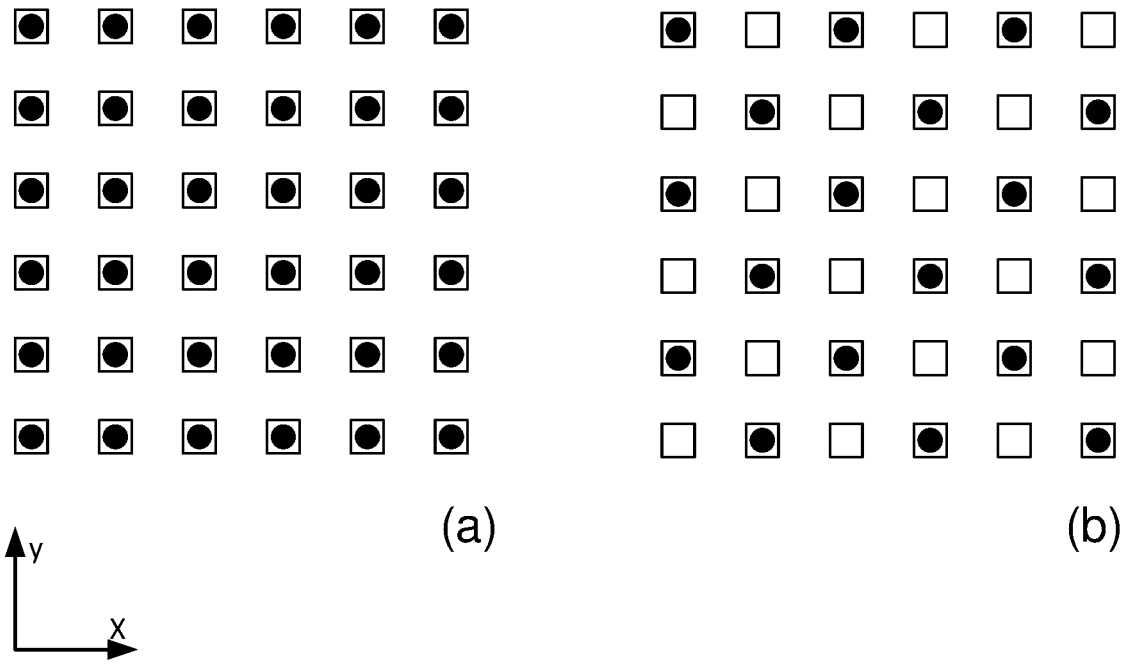
FIG. 13 illustrates a parallel measurement arrangement for measuring a plurality of targets or target arrangements simultaneously (a) at a conventional wafer orientation; and (b) at an oblique wafer orientation as proposed in embodiments of the invention.

In some metrology tools (either present or in future), a parallel array of sensors may be used to measure multiple targets simultaneously so as to increase throughput. FIG. 13(a) illustrates such an arrangement measured at a conventional wafer orientation (e.g., zero degrees). Each square signifies a target and each circle a corresponding sensor to measure the target. When measuring a wafer rotated to an oblique angle (e.g., to measure any of the targets having oblique gratings described above), it will be clear that such parallel measurement will pose a problem as the sensor array cannot simply be rotated accordingly. However, FIG. 13(b) illustrates that provided the rotation angle is a fraction of the field-size height/width ratio, the targets on a rotated wafer can still be measured with a parallel sensor array (e.g. using half of the sensors simultaneously).

It has been demonstrated (based on numerical simulation) that the abovementioned targets enable the surrounding structures to be placed in close proximity to the targets, and even have a similar pitch as the target, and yet be robust to impact of resulting optical crosstalk. For example, simulations of the target illustrated in FIG. 8(a) shows much smaller overlay errors compared to a conventional target when and adjacent product area was present. Furthermore, simulations of the target illustrated in FIG. 8(b), additionally showed little difference between the overlay error, and overlay error swing curve as a function of ROI size, when measured with and without adjacent product areas. Therefore, this design not only reduces the overlay error due to cross-talk from product but also reduces intra-grating cross-talk effects, thereby making it almost completely insensitive to the presence of nearby product.

The concepts described above extend to the patterning device(s) or reticle(s) used to form the targets described and disclosed, and/or substrates or wafers having such targets exposed/printed thereon.

As an alternative to optical metrology methods, it has also been considered to use soft X-rays or EUV radiation, for example radiation in a wavelength range between 0.1 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The content of the cited US patent application are incorporated herein by reference in their entirety.

Figure 14:
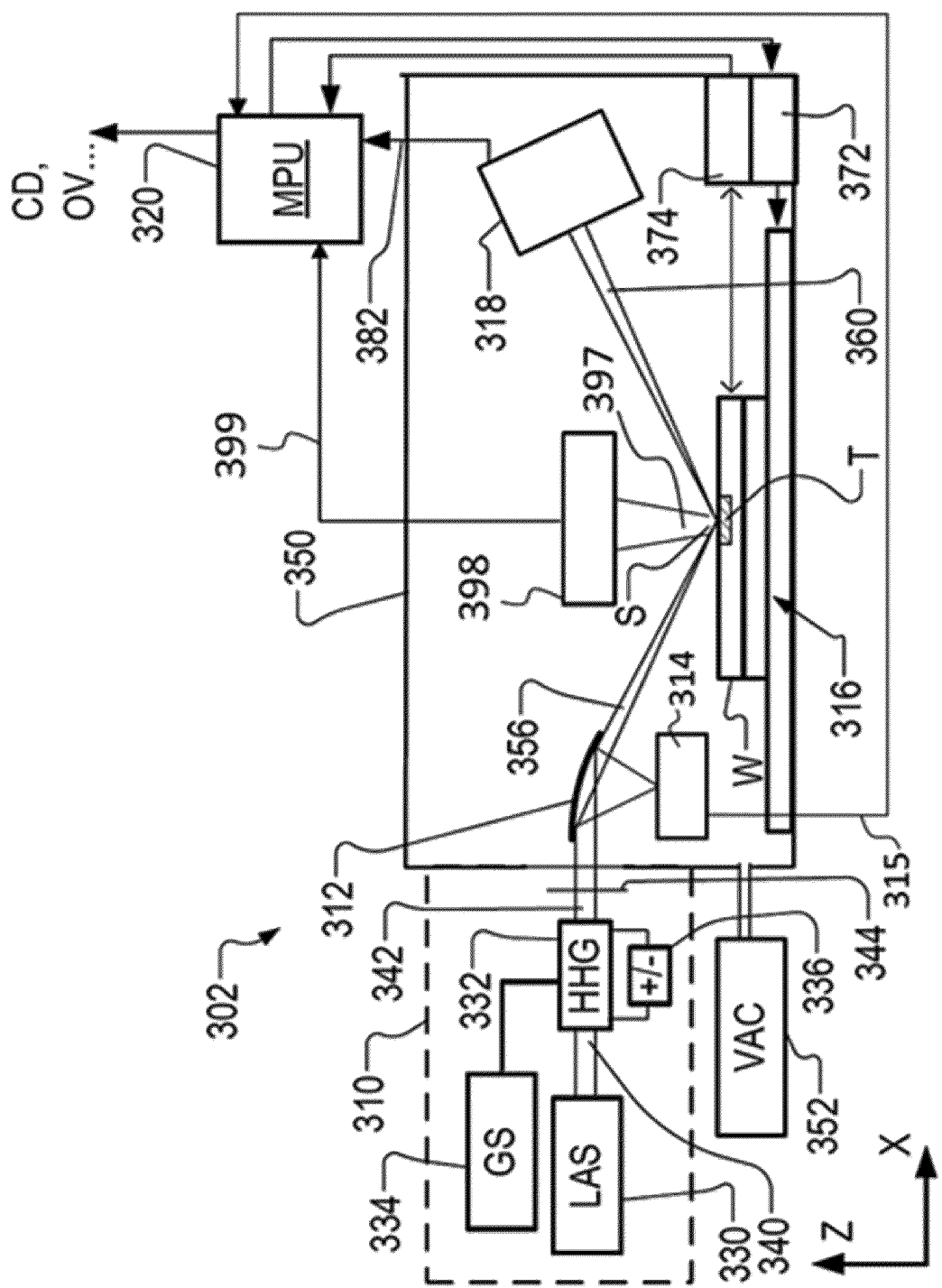
FIG. 14 depicts a schematic overview of a further metrology device which can measure targets according to embodiments of the invention.

FIG. 14 depicts a schematic representation of a metrology apparatus 302 in which radiation in the wavelength range from 0.1 nm to 100 nm may be used to measure parameters of structures on a substrate. The metrology apparatus 302 presented in FIG. 4 is suitable for the soft X-rays or EUV domain.

FIG. 14 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Such sources are available for example from KMLabs, Boulder Colorado, USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar), N2, O2, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 μm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise an soft X-ray and/or EUV spectroscopic reflectometer of the kind described in US2016282282A1 which content is incorporated herein by reference in is entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 4, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 4 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus For SXR metrology in particular it is considered technologically very difficult to achieve low overfill (0.01%) on small (5×5 μm) targets. For such a tool, it should be appreciated that use of rotated or oblique targets (as disclosed herein, particularly where the target grating is also rotated with respect to the product) results in the entire diffraction signal of the target rotating around the center of the pupil with respect to that of the product, entirely separating the diffraction from the target and the product. This eliminates the impact of overfill entirely. In principle an arbitrarily small angle would achieve this, but in practice due to the finite beam divergence (meaning it actually diffracts in a cone, not a single angle) an angle in the order of 5 mrad or greater should be used. In this manner, the pattern that is detected on detector 398 has separate areas for the rotated targets with respect to the surrounding product structures.

In another embodiment of a compound target arrangement comprising multiple targets, such as a target arrangement comprising multiple overlay biases for a DBO-like measurement, such a target arrangement can be combined and measured into one acquisition using multiple rotations (i.e., each target comprises a different rotation. This eliminates move time and drift between the measurements.

Another realization of this is to use only a single bias in the target, and to make the target so small that about half the incident measurement radiation falls on the target and the other half on the product structures. The unbiased product structure can be used as the differently biased target of a DBO pair in a DBO measurement.

Such rotated/oblique targets (including those with rotated pitches) are simple to implement (print). These designs are not restricted to only spatially coherent illumination but may be used in combination with tools which use spatially incoherent illumination or partially spatially coherent illumination. The methods described herein may be applied in general to any case where optical crosstalk suppression is desired. The proposed approach is independent from existing approaches which focus on sensor and imaging aspects (e.g. pupil masking, pupil apodization, etc.). As such it provides an additional solution approach which can be implemented in concert to augment other approaches. In short, it provides an additional stand-alone 'tool' in the 'tool-kit' for mitigating optical crosstalk.

While the principles above are described in relation to overlay targets and overlay target arrangements, they can also be applied to other parameters of interest; for example focus targets for inferring the focus setting used to print the target. Such focus targets may comprise, for example diffraction based focus targets which print with a focus dependent asymmetry which can be measured by, for example, the metrology tool of FIG. 5. Other applications include targets for measuring CD and/or other dimensions of interest (e.g., as part of a profile reconstruction). Another possible application is image based overlay (IBO), where the targets can be rotated for each layer. The target orientation may even be different per layer.

Further embodiments are disclosed in the subsequent numbered clauses:
1. A patterning device for patterning product structures onto a substrate, the patterning device comprising:
target patterning elements for patterning at least one target from which a parameter of interest can be inferred, and product patterning elements for patterning said product structures;
wherein said target patterning elements and product patterning elements are configured such that said at least one target has at least one boundary which is neither parallel nor perpendicular with respect to said product structures on said substrate.

2. A patterning device as defined in clause 1, said target patterning elements are configured such that said at least one boundary is between 10 and 80 degrees with respect to said product structures.

3. A patterning device as defined in clause 1, said target patterning elements are configured such that said at least one boundary is between 20 and 70 degrees with respect to said product structures.

4. A patterning device as defined in any preceding clause, said target patterning elements are configured such that the target comprises a periodic structure with a direction of periodicity either parallel or perpendicular with respect to said product structures.

5. A patterning device as defined in any of clauses 1 to 3, wherein said target patterning elements are configured such that the target comprises a periodic structure with a direction of periodicity neither parallel nor perpendicular with respect to said product structures.

6. A patterning device as defined in clause 5, wherein said target patterning elements are configured to pattern at least a pair of said targets, each having a periodic structure with a mutually different direction of periodicity which is neither parallel nor perpendicular with respect to said product structures.

7. A patterning device as defined in any preceding clause, wherein said target patterning elements are configured such that said at least one target has all of its boundaries neither parallel nor perpendicular with respect to said product structures.

8. A patterning device as defined in clause 7, wherein said target patterning elements are configured such that said target comprises a rhombus shape.

9. A patterning device as defined in clause 8, wherein said target patterning elements are configured such that said target comprises a rectangle or square oriented at an angle neither perpendicular nor parallel to said product structures.

10. A patterning device as defined in any of clauses 1 to 6, wherein said target patterning elements are configured such that said target comprises a triangular shape.

11. A patterning device as defined in clause 10, wherein said target patterning elements are configured to pattern four of said targets in a rectangular or square target arrangement.

12. A patterning device as defined in any preceding clause, wherein said target patterning elements are configured to pattern two pairs of said targets in a target arrangement comprising a first pair for measuring the parameter of interest in a first measurement direction and a second pair for measuring the parameter of interest in a second measurement direction and such that the first pair of targets are not aligned in the second measurement direction and the second pair of targets are not aligned in the first measurement direction.

13. A patterning device as defined in clause 12, wherein said first measurement direction and said second measurement direction are mutually perpendicular.

14. A patterning device as defined in any preceding clause, wherein said target patterning elements are configured such that said at least one target has at least one boundary which is neither parallel nor perpendicular with respect to one or both of a boundary of a product area defined by the product patterning elements and a direction of periodicity of the product patterning elements.

15. A patterning device as defined in clause 14, wherein the substrate has a coordinate system defined by a predominant orientation of the product structures; and said target patterning elements are configured such that said at least one target has said at least one boundary which is neither parallel nor perpendicular with respect to the substrate's coordinate system.

16. A patterning device as defined in clause 15, wherein said boundary of a product area defined by the product patterning elements and/or the direction of periodicity of the product patterning elements are all either parallel or perpendicular with respect to the substrate's coordinate system.

17. A patterning device as defined in any of clauses 14 to 16, wherein at least some of the product patterning elements are local to the target patterning elements.

18. A patterning device as defined in any of clauses 14 to 16 configured for use with a specific lithographic system comprising a metrology tool, said metrology tool having a defined field of view; and at least some of the product patterning elements are located within a distance of the target patterning elements on the patterning device such that the corresponding distance on the substrate between the target and the product structures are within said field of view of the metrology tool.

19. A patterning device as defined clause 17 or 18, wherein at least some of the product patterning elements are located within a distance of the target patterning elements on the patterning device such that the corresponding distance between the target and the product structures are within 50 µm of each other on the substrate.

20. A patterning device as defined in any preceding clause, wherein said target patterning elements and product patterning elements are configured such that said at least one target comprises a periodic structure having a first direction of periodicity, said first direction of periodicity being parallel with a first direction of periodicity of the product structures.

21. A patterning device as defined clause 20, wherein said target patterning elements are configured to pattern a target arrangement consisting of only a pair of said targets each having said first direction of periodicity.

22. A patterning device as defined clause 20, wherein said target patterning elements are configured to pattern a target arrangement comprising a first pair of said targets having said first direction of periodicity and a second pair of said targets having a second period of periodicity.

23. A patterning device as defined clause 22, wherein said target patterning elements are configured such that said second direction is perpendicular to the first direction.

24. A patterning device as defined in clause 22, wherein said target patterning elements and product patterning elements are configured such that said second direction is non-perpendicular to the first direction and parallel to a second direction of periodicity of the product structures.

25. A patterning device as defined in any preceding clause, wherein said target patterning elements are configured to sub-segment the target; and wherein a direction of periodicity of the sub-segmentation is neither parallel nor perpendicular with said product structures.

26. A patterning device as defined in any of clauses 1 to 24, wherein said target patterning elements are configured to sub-segment the target; and wherein a direction of periodicity of the sub-segmentation is either parallel or perpendicular with said product structures.

27. A patterning device for patterning product structures onto a substrate, the patterning device comprising:
target patterning elements for patterning at least one target from which a parameter of interest can be inferred, said target patterning elements being configured to form a sub-segmented target; and product patterning elements for patterning said product structures;

wherein said target patterning elements and product patterning elements are configured such that a direction of periodicity of the sub-segmentation of the sub-segmented target is neither parallel nor perpendicular with the respect to said product structures on said substrate.

28. A pair of complementary patterning devices comprising a first patterning device and a second patterning device, wherein at least one of said pair of complementary patterning devices comprise a patterning devices of any preceding clause, wherein the target patterning elements in said first patterning device are configured to provide a first target in a first layer and the target patterning elements in said second patterning device are configured to provide a second target overlaying said first target in a second layer said first target and second target together forming an overlay target, said parameter of interest being overlay.

29. A pair of complementary patterning devices as defined in clause 28, wherein said first patterning device and second patterning device each comprise one of complementary patterning devices of any preceding clause.

30. A pair of complementary patterning devices as defined in clause 28, wherein said first patterning device comprises target patterning elements configured such that said first target comprises a two-dimensional grating aligned neither parallel nor perpendicular with respect to said product structures; and which can be used for measurement of alignment.

31. A substrate comprising a target or target arrangement formed in a lithographic process using the patterning device or pair of patterning devices as defined in any preceding clause.

32. A substrate comprising:
product structures operable to form a functioning integrated circuit or part thereof; and
a target for measuring from which a parameter of interest can be inferred,
wherein said target has at least one boundary which is neither parallel nor perpendicular with respect to said product structures.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A patterning device for patterning product structures onto a substrate, the patterning device comprising:
   target patterning elements configured to pattern at least one target comprising target structures on the substrate from which at least one target a parameter of interest can be inferred; and
   product patterning elements configured to pattern the product structures,
   wherein the target patterning elements and product patterning elements are configured such that the at least one target has at least one boundary which is neither parallel nor perpendicular with respect to the product structures on the substrate and wherein at least some of the product patterning elements are located within a distance of at least some of the target patterning elements on the patterning device such that target structures on the substrate corresponding to those at least some target patterning elements and product structures on the substrate corresponding to those at least some product patterning elements are within a defined field of view of a metrology tool to measure those at least some target structures or such that target structures on the substrate corresponding to those at least some target patterning elements are within 60 μm of product structures on the substrate corresponding to those at least some product patterning elements.

2. The patterning device as claimed in claim 1, wherein the target patterning elements are configured such that the at least one boundary is between 10 and 80 degrees with respect to the product structures.

3. The patterning device as claimed in claim 1, wherein the target patterning elements are configured such that the at least one target comprises a periodic structure with a direction of periodicity either parallel or perpendicular with respect to the product structures.

4. The patterning device as claimed in claim 1, wherein the target patterning elements are configured such that the at least one target comprises a periodic structure with a direction of periodicity neither parallel nor perpendicular with respect to the product structures.

5. The patterning device as claimed in claim 4, wherein the target patterning elements are configured to pattern at least a pair of the targets, each having a periodic structure with a mutually different direction of periodicity which is neither parallel nor perpendicular with respect to the product structures.

6. The patterning device as claimed in claim 1, wherein the target patterning elements are configured such that the at least one target has all of its boundaries neither parallel nor perpendicular with respect to the product structures.

7. The patterning device as claimed in claim 6, wherein the target patterning elements are configured such that the at least one target comprises a rectangle or square oriented at an angle neither perpendicular nor parallel to the product structures.

8. The patterning device as claimed in claim 6, wherein the target patterning elements are configured such that the at least one target comprises a rhombus shape.

9. The patterning device as claimed in claim 1, wherein the target patterning elements are configured such that the at least one target comprises a triangular shape.

10. The patterning device as claimed in claim 9, wherein the target patterning elements are configured to pattern four of the targets in a rectangular or square target arrangement.

11. The patterning device as claimed in claim 1, wherein the target patterning elements are configured to pattern two pairs of the targets in a target arrangement comprising a first pair for measuring the parameter of interest in a first measurement direction and a second pair for measuring the parameter of interest in a second measurement direction and such that the first pair of targets are not aligned in the second measurement direction and the second pair of targets are not aligned in the first measurement direction.

12. The patterning device as claimed in claim 11, wherein the first measurement direction and the second measurement direction are mutually perpendicular.

13. The patterning device as claimed in claim 1, wherein the target patterning elements are configured such that the at least one target has at least one boundary which is neither parallel nor perpendicular with respect to one or both of a boundary of a product area defined by the product patterning elements and a direction of periodicity of the product patterning elements.

14. The patterning device as claimed in claim 13, wherein the substrate has a coordinate system defined by a predominant orientation of the product structures; and the target patterning elements are configured such that the at least one target has the at least one boundary which is neither parallel nor perpendicular with respect to the substrate's coordinate system.

15. A pair of complementary patterning devices comprising a first patterning device and a second patterning device, wherein at least one patterning device of the pair of complementary patterning devices comprises the patterning device of claim 1, wherein the target patterning elements in a first patterning device of the pair of complementary patterning devices are configured to provide a first target in a first layer and the target patterning elements in a second patterning device of the pair of complementary patterning devices are configured to provide a second target overlaying the first target in a second layer the first target and second target together forming an overlay target, the parameter of interest being overlay.

16. A substrate comprising a target or target arrangement formed in a lithographic process using the patterning device as claimed in claim 1.

17. The method of claim 1, wherein at least some of the product patterning elements are located within a distance of at least some of the target patterning elements on the patterning device such that target structures on the substrate corresponding to those at least some target patterning elements are within 60 μm of product structures on the substrate corresponding to those at least some product patterning elements.

18. A patterning device for patterning product structures onto a substrate, the patterning device comprising:
    target patterning elements configured to pattern at least one target from which a parameter of interest can be inferred, the target patterning elements being grating lines and at least one of the grating lines is a sub-segmented; and
    product patterning elements configured to pattern the product structures,
    wherein the target patterning elements and product patterning elements are configured such that a direction of periodicity of the sub-segmentation is neither parallel nor perpendicular with the respect to the product structures on the substrate.

19. A pair of complementary patterning devices comprising a first patterning device and a second patterning device, wherein at least one patterning device of the pair of complementary patterning devices comprises the patterning device of claim 18, wherein the target patterning elements in a first patterning device of the pair of complementary patterning devices are configured to provide a first target in a first layer and the target patterning elements in a second patterning device of the pair of complementary patterning devices are configured to provide a second target overlaying the first target in a second layer the first target and second target together forming an overlay target, the parameter of interest being overlay.

20. A substrate comprising:
    product structures operable to form a functioning integrated circuit or part thereof; and
    a target configured to be measured and from which a parameter of interest can be inferred,
    wherein the target has at least one boundary which is neither parallel nor perpendicular with respect to the product structures and wherein at least some of the product structures and at least some of target elements of the target are within a defined field of view of a metrology tool to measure those at least some target elements or at least some of the product structures are within 60 μm of at least some of the target elements.

* * * * *